United States Patent [19]

Berrou

[11] Patent Number: 5,446,747
[45] Date of Patent: Aug. 29, 1995

[54] ERROR-CORRECTION CODING METHOD WITH AT LEAST TWO SYSTEMATIC CONVOLUTIONAL CODINGS IN PARALLEL, CORRESPONDING ITERATIVE DECODING METHOD, DECODING MODULE AND DECODER

[75] Inventor: Claude Berrou, Le Conquet, France

[73] Assignees: France Telecom; Telediffusion de France S.A., both of France

[21] Appl. No.: 870,614

[22] Filed: Apr. 16, 1992

[30] Foreign Application Priority Data

Apr. 23, 1991 [FR] France .................................. 91 05280

[51] Int. Cl.⁶ .............................................. G06F 11/10
[52] U.S. Cl. ........................................ 371/45; 371/43; 375/340
[58] Field of Search ................... 371/43, 44, 45, 41, 371/37.1; 375/59, 75, 94

[56] References Cited

U.S. PATENT DOCUMENTS

| | | | |
|---|---|---|---|
| 3,652,998 | 3/1972 | Forney, Jr. | |
| 4,677,625 | 6/1987 | Betts et al. | 371/43 |
| 4,677,626 | 6/1987 | Betts et al. | 371/43 |
| 4,881,241 | 11/1989 | Pommier et al. | 375/38 |
| 5,077,741 | 12/1991 | Kotzin | 371/30 |
| 5,157,671 | 10/1992 | Karplus | 371/43 |
| 5,263,051 | 11/1993 | Eyuboglu | 371/43 |
| 5,287,374 | 2/1994 | Parr | 371/43 |
| 5,289,501 | 2/1994 | Seshadri et al. | 375/17 |

FOREIGN PATENT DOCUMENTS

| | | | |
|---|---|---|---|
| 0235477 | 9/1987 | European Pat. Off. | H03M 13/00 |
| 2616986 | 12/1988 | France | H03M 13/12 |

OTHER PUBLICATIONS

Dr. G. Lomp et al 'Projection Codes—A New Class of FEC Burst Correction and ARQ Codes for Mobile Radio' IEEE 1988 pp. 463–467.

G. Fettweis 'Cascaded Feedforward Architectures for Parallel Viterbi Decoding' IEEE 1990 pp. 978–981.

Iteratively Maximum Likelihood Decodable Spherical Codes and a Method for their Construction. Gao et al. IEEE 1988 pp. 480–485.

Dunscombe and Piper, *Optimal Interleaving Scheme for Convolutional Coding*, Aug. 1989; Electronics Letters, Oct. 26, 1989, vol. 25, No. 22.

Battail, et al. *Decodage Pondere des Codes Concatenes Avec Code Interieur Convolutif;* Onzieme Colloque; Jun. 1987.

Mackenthun, *Block orthogonal convolutional coding for the Intelsat TDMA data channel*, Comsat Technical Review, Fall 1984.

Nakano, et al. *New Decoding Methods of Interleaved Burst Error-Correcting Codes*, Electronics and Communications in Japan, Apr. 1983.

Primary Examiner—Robert W. Beausoliel, Jr.
Assistant Examiner—Albert Decady
Attorney, Agent, or Firm—Locke Reynolds

[57] ABSTRACT

An error-correction method for the coding of source digital data elements to be transmitted or broadcast, notably in the presence of high transmission noise, the method comprising at least two independent steps of systematic convolutional coding, each of the coding steps taking account of all of the source data elements, the method comprising at least one step for the temporal interleaving of the source data elements, modifying the order in which the source data elements are taken into account for each of the coding steps, and a corresponding iterative decoding method using, for the decoding, at each iteration, an intermediate data element obtained by the combination of the received data element with a data element estimated during the previous iteration.

22 Claims, 5 Drawing Sheets

ERROR-CORRECTION CODING METHOD WITH AT LEAST TWO SYSTEMATIC CONVOLUTIONAL CODINGS IN PARALLEL, CORRESPONDING ITERATIVE DECODING METHOD, DECODING MODULE AND DECODER

BACKGROUND OF THE INVENTION

1. Field of the Invention

The field of the invention is that of the coding of digital data belonging to a sequence of source data designed to be transmitted, or broadcast, notably in the presence of transmission noise, and of the decoding of coded data thus transmitted.

More specifically, the invention relates to a method of error correction coding that relies notably on a totally novel approach involving the concatenation of several codes, and to a decoding method that enables the making of modular decoders, with several levels of quality depending on the number of modules implemented.

The invention can be applied whenever where it is necessary to transmit digital information with a certain degree of reliability. A preferred field of application of the invention is that of digital transmission on highly noise-ridden channels. For example, the invention may be implemented for the transmission and reception of signals by satellite. It can also be used advantageously for spatial transmission towards or between spaceships and/or space probes and, more generally, whenever the reliability of the decoding is of vital importance. However, the invention can be applied similarly to any type of transmission, by r.f. or by cable.

Any digital signal, whatever may be its origin, can be coded and decoded according to the invention. It may be, for example, an image signal, a sound signal, a data signal or a multiplex of several distinct signals.

2. Description of the Prior Art

In a known way, signals such as these are generally coded by means of one or more convolutional coders. In the decoder, the original data elements are most frequently reconstructed by means of a maximum likelihood algorithm, for example a Viterbi algorithm, the decisions of which may possibly be weighted.

Convolutional codes are codes that associate at least one coded data element with each source data element, this coded data element being obtained by the summation modulo 2 of this source data element with at least one of the preceding source data elements. Thus, each coded symbol is a linear combination of the source data element to be coded and of previous data source elements taken into account. The Viterbi algorithm, taking account of a sequence of received coded symbols, gives an estimation of each data element coded at transmission, in determining the source sequence that most probably corresponds to the received sequence.

There also exists a known way of placing several coders in series, whether they are convolutional or not. In this case, the data elements coded by a first coder feed a second coder which "overcodes" these data elements. The decoding is obviously done symmetrically, in starting with the second code.

This principle, known as that of the concatenation of codes, has two types of drawbacks. Firstly, the overall efficiency rate of the coders implementing concatenated codes is low. For example, in the case of two coders in series each having a rate $\frac{1}{2}$, the overall rate will be $\frac{1}{4}$. If more than two decoders are used, this rate will soon become very low.

Besides, the technical making of these coders is relatively complex, notably as regards the clock signals associated with each code which have to be independent.

With respect to decoders, it has already been indicated that the algorithms generally used are maximum likelihood algorithms such as the Viterbi algorithm. These algorithms take decisions in taking account of a large number of received symbols. Clearly, the reliability of the decision increases with the number of symbols taken into account. By contrast, the higher the number, the more complex is the decoder. The memory space needed soon becomes very substantial, as do the corresponding computation times.

The integrated circuits that implement such algorithms therefore most usually rely on a compromise between cost and performance characteristics. These industrial choices do not enable the construction of decoders that correspond optimally to a given application. It is, for example, not possible to make low-cost decoders for applications where reception quality is not vital, the integrated circuits having an excessively high cost. Nor, on the other hand, are these integrated circuits adapted to the making of very high quality decoding receivers, for which the cost price is of little importance.

SUMMARY OF THE INVENTION

It is an aim of the invention notably to overcome these different drawbacks and limits of the prior art.

More specifically, an aim of the invention is to provide a method for the coding and a method for the decoding of digital data with very high corrective capacity as compared with the known methods currently used in digital communications systems.

It is an object of the invention, notably, to provide methods such as these that are particularly efficient, again in comparison with known methods, for transmission in highly noise-ridden channels.

A particular aim of the invention is to provide methods such as these permitting highly reliable decoding of the received data, for example data transmitted by satellites or coming from space probes or spacecraft.

A further aim of the invention is to provide methods such as these, enabling the coding and decoding of data at very high bit rates.

The invention is also aimed at providing methods such as these, enabling the relatively easy manufacture of coders and decoders as regards their performance characteristics.

Notably, the invention is aimed at providing a coding method such as this that implements several convolutional codes but requires only one clock, in the coder as well as the decoder.

Another aim of the invention is to provide a coding method such as this that has very high overall coding efficiency rate.

The invention is further aimed at providing coding and decoding methods that enable the making of high-performance decoders which, nevertheless, can be easily manufactured on an industrial scale at acceptable costs.

Thus, a particular aim of the invention is to provide methods such as these, enabling the implantation of the decoding method on a surface area of silicon that is small enough for its industrial-scale manufacture to be possible (for example an area smaller than 50 mm²).

The invention is also aimed at providing coding and decoding methods such as these that enable the making of numerous types of decoders, with performance characteristics and cost prices that can vary as a function of the requirements that they fulfil, and that use one or more integrated circuits of a single type.

In other words, an essential aim of the invention is to provide methods such as these that enable, firstly, profitable industrial-scale manufacture based on the development of a single, relatively simple integrated circuit and, secondly, the making of decoders that can be used for a wide variety of applications.

These aims, as well as others that shall be described hereinafter, are achieved according to the invention by means of a method for the error-correction coding of source digital data elements, implementing in parallel at least two independent steps of systematic convolutional coding, each of said coding steps taking account of all of said source data elements, the method comprising at least one step for the temporal interleaving of said source data elements, modifying the order in which said source data elements are taken into account for each of said coding steps.

This method, hereinafter called method of "parallel concatenation" coding, by contrast with the standard technique of "series concatenation" described in the introduction, makes it possible, during the decoding, to have available symbols coming from two distinct decoders.

The redundant codes used are of a systematic type. Each source data element is therefore also a convolutional coding symbol, and this symbol is shared by both codes.

The dividing of the coding redundancy into several parallel redundancies thus enables the artificial raising of the overall efficiency rate of the code. For example, a "parallel concatenation" code with an efficiency rate of $\frac{1}{3}$ may actually contain codes with an efficiency rate of $\frac{1}{2}$. In the standard method, namely the method of series concatenation, if the operation had involved the concatenation of two codes with an efficiency rate of $\frac{1}{2}$, then the overall efficiency rate would have been $\frac{1}{4}$.

Another advantage of parallel concatenation codes as compared with series concatenation codes is the simplicity of the coding and decoding circuits, in relation to the clock signals.

In a preferred embodiment, the coding method comprises a step for the systematic elimination, at predetermined instants of transmission, of at least one coded data element produced by at least one of said coding steps.

The elimination step may, for example, consist of a periodic switching among said coding steps by which, at each transmission instant, a single coded symbol is selected from among the set of symbols coded by each of said coding steps.

In this way, a single coded symbol is transmitted at each instant of transmission: there is no increase in the overall data bit rate. By contrast, the coding method of the invention provides for the systematic transmission of the source data at each instant of transmission.

This embodiment makes use of so-called pseudo-systematic codes such as those described in the French patent application No. 91 05278 entitled "Pseudo-Systematic Error-Correction Convolutional Coding Method, Decoding Method and Corresponding Devices", filed on 23rd Apr. 1991. These codes can be used to obtain very good decoding quality, especially in the presence of high transmission noise. Besides, their systematic characteristic makes them very promissing for the implementation of the decoding method described further below.

Advantageously, each of said temporal interleaving steps is followed by a delay step, said temporal interleaving step taking account of the source data elements in the order in which said source data elements feed a first coding step and restoring them in a different order to feed a second coding step, said delay step assigning, to each of said source data elements coming from said temporal interleaving step, a delay equal to the latency of decoding of data elements coded by said first coding step.

These delays prove to be useful for the implementation of an embodiment of the decoding method of the invention, as shall be seen hereinafter.

Advantageously, said temporal interleaving step implements at least one interleaving matrix in which said source data elements are recorded in successive rows (and columns respectively) and read in successive rows (and columns respectively).

This interleaving step enables all the source data elements to be taken into account and coded, but according to different sequences for the two codes. The interleaving can therefore be done in a standard way, by means of an interleaving matrix. However, the invention proposes several possible adaptations of this technique, aimed at improving the effectiveness of the interleaving.

Thus preferably, at writing, the increment between two rows (and columns respectively) and/or at reading, the increment between two columns (and rows respectively) is strictly greater than 1.

By necessity, these increments are naturally also relatively prime with the numbers of columns or rows of this matrix.

Advantageously, at writing (and reading respectively), said increment between two rows (and columns respectively) is a function of the position of the column (or row respectively) during writing (or reading respectively).

This technique has the favorable effect, during the decoding, of "breaking" the rectangularly arranged error packets with respect to which the decoding method is more vulnerable. This interleaving technique shall be known hereinafter as the "dispersal technique".

Indeed, the invention also relates to a method for the decoding of digital data elements received in coded form and corresponding to source data elements comprising an iterative decoding procedure comprising:
 a step for the decoding of an intermediate data element representing a received data element, producing a decoding data element, and
 a step for the estimation of said received data element, by means of said decoded data element, producing an estimated data element, said intermediate data element being obtained, for the first iteration, by a combination of said received data element with a pre-determined value, and for the following iterations, by a combination of said received data element with one of said data elements estimated during the preceding iterations.

This method can be used to make decoders formed by a cascade of identical modules, each module corresponding to an iteration. It is clear that the efficiency rate of the decoding directly depends on the number of iterations made and hence on the number of modules used. It is thus possible to define several levels of qualities of receivers, simply by varying the number of modules.

Each module therefore has the task of computing, in addition to the decoded data element, a new estimation of the data element emitted. This variable is used from the next module onwards.

Advantageously, said estimation step assigns said estimated data element an additive noise decorrelated from the noise assigned to said received data element.

Thus, the data element taken into account during the following iteration, which is a combination of the received data element and of the estimated data element, is affected by an overall noise that is less disturbing than in the preceding iteration.

In a preferred embodiment of the invention, said predetermined value is neutral or zero and said combinations are, for iterations other than the first one, summations of said received data element and of the last estimated data element.

In the case of a decoding of data coded according to a method that carries out the joint transmission of source data elements and redundancy data elements coded for example by means of the already mentioned "pseudo-systematic" codes, it is advantageous for said decoding step to take account of all the received data elements, source data elements and coded data elements, but said estimation step is applied solely to the estimation of said source data elements.

According to a particular embodiment of the invention, of the type carrying out the decoding of data coded according to a coding method implementing two redundant coding steps in parallel, the first coding step carrying out a first redundant coding on all the source data taken in their natural order and the second coding step carrying out a second redundant coding on all the source data taken in an order modified by a temporal interleaving step, the decoding method comprises the following consecutive steps:
  first decoding according to said first redundant coding, as a function of at least one of said intermediate data elements and of at least one coded data element produced by said first coding step, producing a first coded data element;
  temporal interleaving identical to said interleaving step of the coding method of said first decoded data elements;
  second decoding according to said second redundant coding, as a function of at least one of said first decoded and de-interleaved data elements and of at least one coded data element produced by said second coding step, producing a second coded data element;
  estimation of the received source data element, as a function of at least one of said first and second decoded data elements, producing an estimated data element;
  de-interleaving, symmetrical to said interleaving step, of said estimated data elements.

Advantageously, said estimation step consists in determining the variable $(d_2 x(X_1)-(X_2))/d_2-1)$ where:
  $d_2$ is the free distance of said second redundant coding;
  $X_1$ and $X_2$ are the data elements decoded by said first and second decoding steps.

This function removes the contribution related to the source data element from the result of the decoded data element delivered by the second decoding step. Thus, the additive noises of the source data element and of the estimated data element are practically completely decorrelated.

Preferably, said estimation step is followed, before said de-interleaving step, by a logarithmic compression step.

This logarithmic compression is designed to place emphasis, in terms of sampling precision, on the critical values, namely on the values close to zero, when the values are coded between $-n$ and $+n$.

In an advantageous embodiment of the invention, said first decoding step is followed by a step for the multiplication of said first decoded data element by a coefficient $\beta$ that is strictly greater than 1.

The role of this coefficient $\beta$ is to give preference, for the second decoding, to the values coming from the first decoder, in relation to the coded values received, affected by a greater noise because they are given directly by the transmission channel.

Preferably, said coefficient $\beta$ is variable as a function of the signal-to-noise ratio of the transmission channel.

Advantageously, said decoding step or steps implement maximum likelihood decoding algorithms of the Viterbi algorithm type with weighted decisions.

It is possible, notably, to use the decoding method described in the contemporaneously filed U.S. application Ser. No. 07/870,483, now U.S. Pat. No. 5,406,570, entitled "Method For The Decoding Of A Maximum Likelihood Convolutional Code With Decision Weighting And Corresponding Decoder" claiming the Convention priority of the French patent application FR 91 05279, filed on Apr. 23, 1991, incorporated herein by reference.

Advantageously, the decoding method also includes a demultiplexing step directing the received coded data elements towards said appropriate decoding steps and transmitting zero values at the decoding steps for which no data element has been transmitted.

This step is useful when coded data elements are selectively non-emitted at certain instants of transmission.

The invention also relates to a decoding module carrying out an iteration of the decoding procedure described here above. A module such as this comprises at least two inputs, corresponding to at least one received data element and to at least one estimated data element, and at least two outputs corresponding to at least one decoded data element and at least one estimated data element. It is capable of being cascaded with at least one other identical module.

A module may notably be made in integrated circuit form. Such a circuit takes up a surface area of silicon that is small enough to enable easy, reliable and low-cost industrial-scale manufacture.

The feature of modularity makes it possible to provide for any type of application on the basis of a a single integrated circuit. In cases requiring only a low level of protection, or when the channel is little affected by noise, only one module may be sufficient. By contrast, in special cases where reliability is an essential factor and/or the transmission noise is high, for example in the case of data transmitted by an interstellar probe, ten or more modules may be cascaded.

The invention also relates to decoders implementing one or more of these modules.

BRIEF DESCRIPTION OF THE DRAWINGS

Other features and advantages of the invention shall appear from the following description of a preferred embodiment of the invention, given by way of a non-restrictive illustration, and from the appended drawings of which.

MORE DETAILED DESCRIPTION

The present invention relies on two novel concepts, namely a coding method simultaneously carrying out several coding operations, in parallel, and a method of iterative coding.

Taken in combination, these two features display a very high degree of synergy, making it possible to obtain a particularly low error rate at decoding, notably an error rate that is far smaller than those obtained with known decoders of equivalent complexity, especially in the presence of high transmission noise.

However, it is clear that these features may be implemented independently without going beyond the scope of the invention. It shall be seen further below that it is possible, according to the embodiment described, to make decoders with only one module: this would correspond to a non-iterative decoding.

Figure 1:
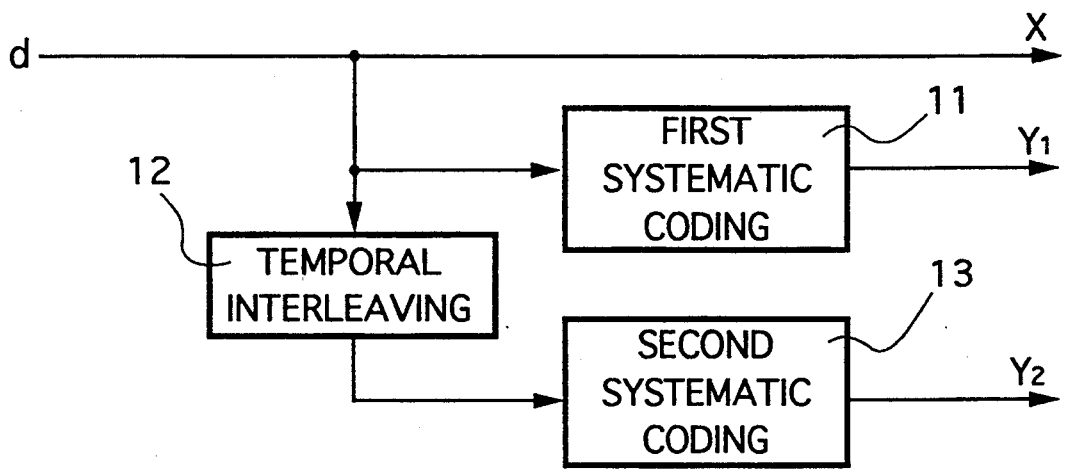
FIG. 1 is a block diagram illustating the basic principle of the coding method of the invention, called "parallel concatenation" coding.

FIG. 1 shows a block diagram of a coder implementing the method of the invention, in an example where two distinct codes are used in parallel.

Each source data element d to be coded is directed, firstly, towards a first coding module 11 and, secondly, towards an temporal interleaving module 12 which itself feed a second coding module 13.

According to this method, it is seen, therefore, that there are at least two coded data elements $Y_1$ and $Y_2$, coming from distinct coders 11 and 13, associated with each source data element. It is clear that the number of coders, limited herein to two, can easily be increased according to the same principle.

The modules 11 and 13 may be of any known systematic type. They are advantageously convolutional coders taking account of at least one of the preceding source data elements for the coding of the source data element d. The codes implemented in these modules 11 and 13 may be identical or, preferably, different.

An essential feature of the invention is that the coded data elements $Y_1$ and $Y_2$ take account of the same source data elements d, but these are considered according to different sequences, through of the interleaving technique. This interleaving may be obtained in a standard way by means of an interleaving matrix in which the source data elements are introduced row by row and restored column by column. As shall be seen further below, the invention nevertheless proposes novel improvements to this interleaving method, designed notably to clearly separate the errors, at decoding.

Besides, any other technique that enables the order of the source data elements to be modified may be used in this temporal interleaving module 12.

In the embodiment shown in FIG. 1, a data element X, equal to the source data element d, is transmitted systematically. This is a feature necessary for the making of the decoding modules as described further below.

In this case, the coding modules 11 and 13 preferably use codes such as those described in the already mentioned French patent application No. FR 91 05278. These codes, known as "pseudo-systematic codes" are characterized by the fact that the source data element is transmitted systematically, jointly with at least one coded data element or redundancy symbol.

These redundancy symbols are constructed in such a way that the free distance of the code is the maximum. They do not take account, as is usually done in the convolutional codes, of a series of previous source data elements, but of a series of auxiliary data elements obtained by the mathematical combination of the source data element considered with at least one of the previous auxiliary data elements.

These novel codes can be used to obtain excellent performance characteristics in terms of error rate.

Figure 7:
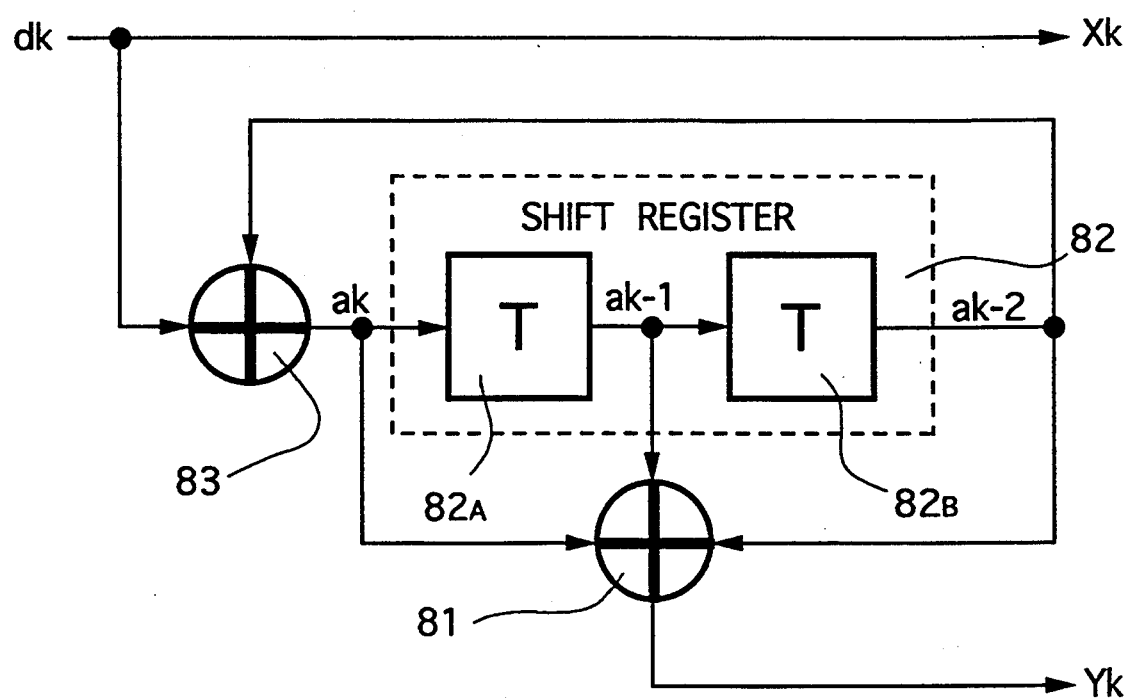
FIG. 7 shows an example of a "pseudo-systematic" coding module, having a constraint length $\nu=2$ and an efficiency rate $R=\frac{1}{2}$, that can be used in the coder of FIG. 1.

An example of a coder (having a constraint length $\nu=2$ and efficiency rate $R=\frac{1}{2}$) implementing this technique is illustrated in FIG. 7.

This coder associates two coded values $X_k$ and $Y_k$ to each source data element $d_k$.

The data element $X_k$ is systematically taken to be equal to the source value $d_k$.

The data element $Y_k$ is computed by means of a combination 81 of at least two binary elements contained in a shift register 82. By contrast, in its cells $82_A$ and $82_B$, the shift register 82 contains not the previous source values $d_{k-1}$, $d_{k-2}$, but distinct intermediate values $a_{k-1}$, $a_{k-2}$.

The essential characteristic of the invention is indeed that of determining the coded value of $Y_k$, on the basis of particular values $a_k$ obtained by a mathematical combination and, for example, an exclusive OR gate 83, of the source data element $d_k$ with at least one of the preceding intermediate values $a_{k-1}$ (contrary to the known convolutional coding methods which take direct account of the series of the preceding source values).

This, in a way, amounts to performing a feedback on the source values $d_k$. It is seen that this feedback makes it possible to obtain performance characteristics greater than those of classic coders while, at the same time, requiring only the addition of an exclusive-OR gate 83 to these coders.

It appears that this gain can be attributed notably to the fact that it is only very rarely that the positions of the tranmission errors in a sequence of received data are completely decorrelated. The application of a combination by exclusive-OR operations on these data elements may then lead to the cancellation of certain of these errors.

Numerous simulations with codes having different constraint lengths and/or efficiency rates have shown that in every possible instance this "pseudo-systematic" coding method has performance characteristics superior to those of standard convolutional coders, equivalent in terms of efficiency rate and constraint length, notably when the signal received is highly noise-infested ($E_b/N_o$ smaller than or equal to 3 dB).

The principle of "parallel concatenation" coding according to the invention has notably two advantages over the standard coding with serial concatenation, as mentioned already: firstly, the overall rate of the code is higher and, secondly, the coding and decoding circuits are simpler as regards their clock signals. Indeed, in the case of "parallel concatenation", all the circuits work at one and the same: that of the data bit rate.

Figure 2:
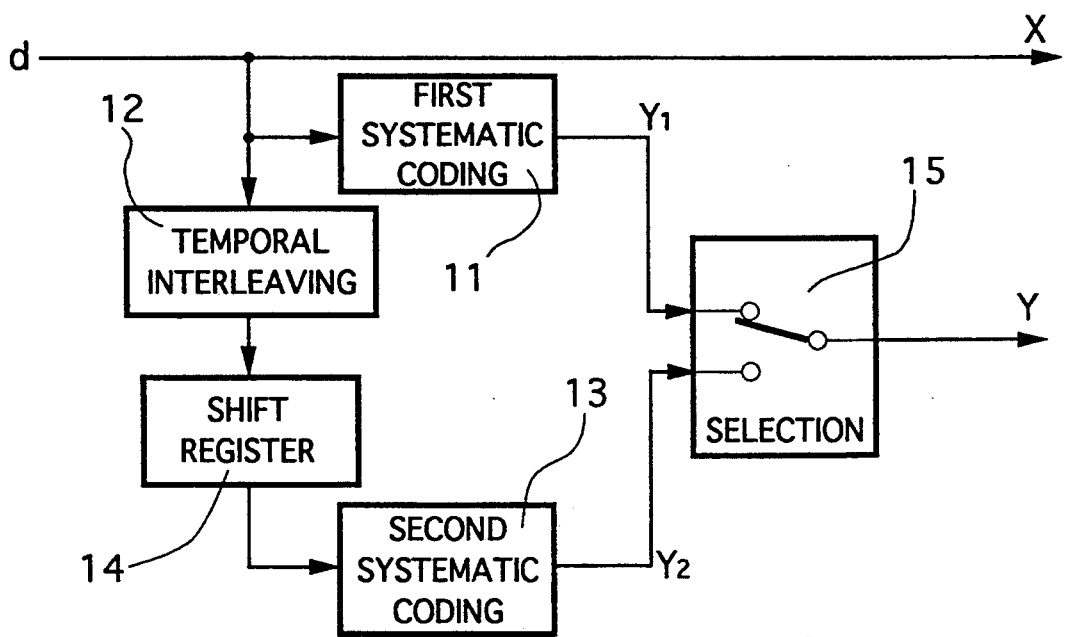
FIG. 2 shows a particular embodiment of a coder according to the method illustrated in FIG. 1, providing for a redundancy of 100%.

FIG. 2 illustrates a particular embodiment of a coder such as this, designed for the coding of data elements that are decodable by means of the modules described further below, in relation to FIG. 4.

As an example, let us take a coder with an overall efficiency rate R higher than or equal to $\frac{1}{3}$ (a typical value of R is $\frac{1}{2}$) implementing two codes with respective elementary rates $R_1$ and $R_2 = (RR_1)/(RR_1 + R_1 - R)$, $R_1$ and $R_2$ being both higher than $\frac{1}{2}$.

At each instant of transmission, this coder emits two digital symbols, for example binary symbols, X and Y. The symbol X is systematically taken to be equal to the source data element d, and the symbol Y is a redundancy symbol.

This symbol Y is equal either to the value $Y_1$ coming from the first coding module 11 or to the value $Y_2$ coming from the coding module 13. A selection module 15 carries out a periodic switching between the outputs $Y_1$ and $Y_2$. The periodicity of the switching is fixed by the two efficiency rates $R_1$ and $R_2$ in such a way that the symbols X and Y effectively contain two codes with efficiency rate $R_1$ and $R_2$.

For example, for code efficiency rates $R_1 = 3/5$ and $R_2 = \frac{2}{3}$, the sequences of data elements transmitted may be:

| $X_t$ | $X_{t+1}$ | $X_{t+2}$ | $X_{t+3}$ | $X_{t+4}$ | $X_{t+5}, \ldots$ |
|---|---|---|---|---|---|
| $Y_{1,t}$ | $Y_{1,t+1}$ | $Y_{2,t+2}$ | $Y_{1,t+3}$ | $Y_{1,t+4}$ | $Y_{2,t+5}, \ldots$ |

The operation of this selection module 15 may naturally be broadened. Thus, should there be more than two coding modules, the selection may be done so as to provide for the transmission of a number m of coded data elements, selected from among the n coded data elements produced. Besides, this selection module 15 may also carry out a puncturing of coded data elements, with the data element (or data elements) Y not being transmitted at predetermined instants of transmission.

The source data elements d are applied to the first coding module 11 and to the interleaving module 12. This module 12 carries out a matrix interleaving. The data elements are written by successive rows in a memory with a size $n_E \times n_E$, and restored by successive columns. This technique is described, for example, by Dunscombe E. and Piper F.C., "Optimal Interleaving Scheme For Convolutional Coding" in *Electronic Letters*, Vol. 25, No. 22, October 1989.

As this article shows, the effectiveness of the interleaving for small values (some tens) of $n_E$ is improved if the succession of rows and columns is done by an increment of more than 1 and, necessarily, relatively prime with $n_E$.

The invention proposes a novel improvement to this interleaving method. It is seen indeed that it is advantageous for the row-skip increment, which is always relatively prime with $n_E$, to be a function of the place of the column considered. This makes it possible to break the rectangularly arranged error packets.

It is naturally possible to use other interleaving techniques, including notably the habitual method using writing and reading increments equal to 1, without going beyond the scope of the invention. It is moreover clear that the roles of the rows and columns may be inverted.

The data elements coming from the interleaving module 12 are then delayed by a fixed duration so as to compensate for the latency $L_1$ of the coding module corresponding to the first code 11. For this purpose, the delay means 14, such as a shift register with a length $L_1$, acting as a delay line, are positioned at output of the interleaving module 12.

Figure 3:
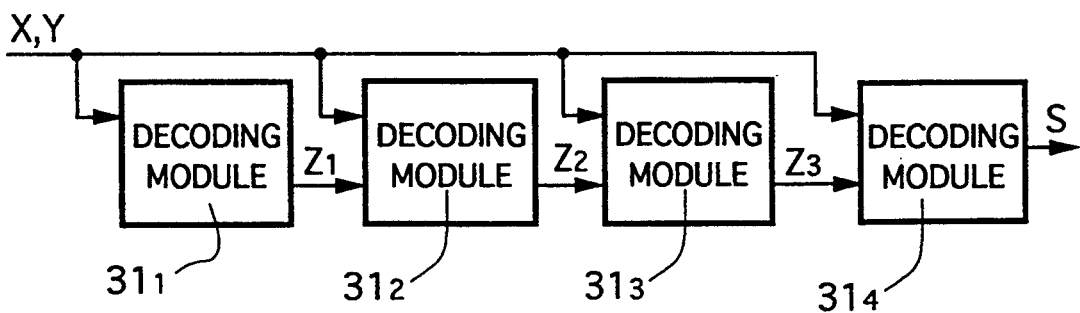
FIG. 3 is a block diagram of the basic principle of a modular decoder according to the invention, with four modules.

The decoding method according to the invention shall now be presented with reference to FIG. 3.

This decoding method has the essential characteristic of being iterative. At each iteration, the decoding of at least one intermediate data element is done. Then, using notably the decoded data element, an estimation of the data element to be decoded is determined. During the next iteration, an identical decoding is done on an intermediate data element obtained by the combination of the received data element with the estimated data element. If the coding method and the estimation method are well chosen it turns out to be the case, as shall be seen further below, that the decoding quality is a function of the number of iterations made.

The essential advantage of this iterative method is that it enables the making of modular decoders. It is indeed possible to define modules decoding $31_1$ to $31_4$ as illustrated in FIG. 3. Each module carries out an iteration of the decoding method. Thus, by cascading n modules, n iterations of the method are made.

The module $31_i$ has at least two inputs: the received data element X to be decoded and a data element $Z_p$, representing this received data element X, estimated by the previous module $31_{p-1}$, and two outputs: the estimated data element $Z_p$ and the decoded value S, taken into account solely at output of the last module. For the first module $31_1$, the data element $Z_1$ is fixed at a predetermined value of zero. Advantageously, the data element $Z_p$ is determined so as to represent the emitted symbol X while at the same time being affected by an additive noise decorrelated from that affecting the received data element X. Thus, as and when the iterations are done, the influence of the noise is increasingly smaller, and the error rate is ever more reduced.

In other embodiments, each module may take account of several data elements $Z_p$ estimated during the preceding steps, or even all these data elements. The combination with the received data element X may be a simple summation or a weighted summation. It is possible to consider, for example, giving a variable weight to the different estimated values $Z_p$. These variable weights may also vary as a function of certain criteria, such as the signal to noise ratio.

The modular structure of the invention notably has two advantages. First of all, it makes it possible to define several qualities of decoders, on one and the same basis, simply by varying the number of modules. This also enables the efficiency rate of an existing decoder to be increased easily by the addition of one or more modules should the need arise.

The different modules work according to the so-called "pipe-line" technique. Each module works permanently on different data elements. The addition of a module does not disturb the working of its predecessors. It only slightly lengthens the total decoding time by the duration needed for its own operations.

Besides, this structure requires the designing and industrial-scale manufacture of only one decoding module, in the form of a relatively simple integrated circuit that does not require an excessively large surface area of silicon. Its cost is therefore not prohibitive, especially as it can be used for a very wide range of applications. Depending on need, it is the number of modules and no longer the structure of the modules that will be variable.

It must be noted that the iterative conception of the method of the invention in no way prevents the making of more conventional decoders using only one module. Indeed, each module has a received data input and a decoded data output S.

Figure 4:
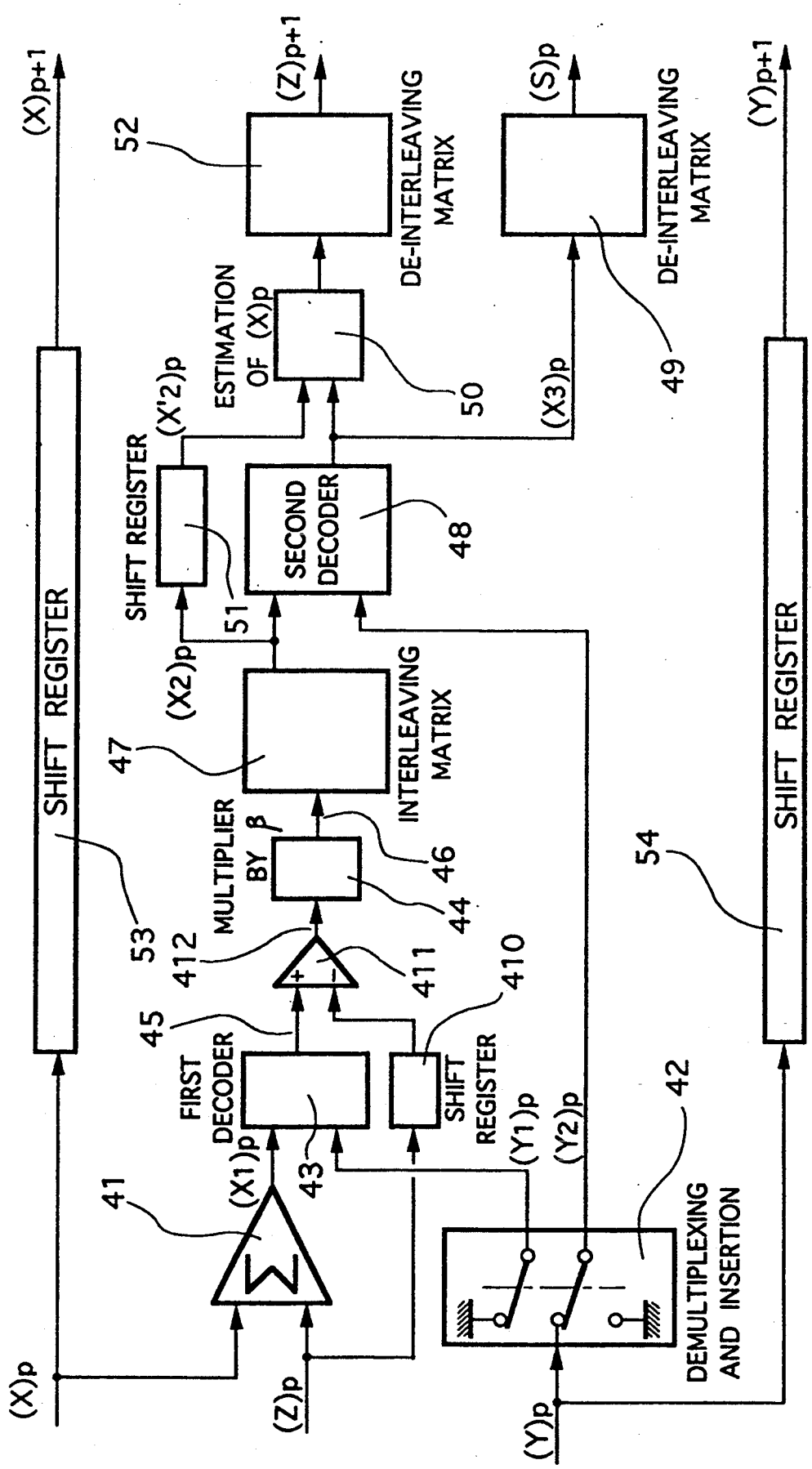
FIG. 4 is a detailed block diagram of a preferred embodiment of a module of FIG. 3, when the data elements are coded by means of the coder of FIG. 2.

FIG. 4 shows a particular embodiment of a module according to the invention, having very promising performance characteristics as can be seen from the curves of FIGS. 5 and 6, commented upon further below.

This module is designed for the decoding of data elements coded and transmitted by means of the coder of FIG. 2.

A p order module such as this therefore possesses:
3 inputs: $(X)_p$, $(Y)_p$ and $(Z)_p$
4 outputs: $(X)_{p+1}$, $(Y)_{p+1}$, $(Z)_{p+1}$, and $(S)_p$.

The variables (X), (Y) and (Z) are ideally real variables and, in practice, samples coded on n bits (typically n=4). The variable (S), which represents the output of the module, is binary. The decision of the complete decoder is given by the output (S) of the last module. As regards the first module, the input variables $(X)_1$ and $(Y)_1$ are given by the corresponding symbols of the coder, after transmission and demodulation. Its input $(Z)_1$ is set at a neutral value (zero weight).

In this module, the data elements at input $(X)_p$ and $(Z)_p$ are added by a summator 41 to give the intermediate data element $(X_1)_p$, which will be used for the decoding instead of the received data element $(X)_p$. As has already been emphasized, the data elements $(X)_p$ and $(Z)_p$ may be weighted if necessary.

The data element $(X)_p$ is transmitted to demultiplexing and insertion means, the role of which is to separate the redundancy $(Z_1)$ produced by the coder 11 (FIG. 2) and the redundancy $(Y_2)$ produced by the coder 13, and to insert neutral values, with zero weight, in the place of the unavailable values (Y).

The data elements $(X_1)_p$ and $(Y_1)_p$ are transmitted to a first decoder 43, carrying out the decoding corresponding to the coder 11. This decoder 43 is built in such a way that the scale at its input $(X_1)$ is double that of its input $(Y_1)$, so as to take account of the fact that $(X_1)$ represents the summation of the two values (X) and (Z).

The output 45 of the decoder 43 is transmitted to a subtractor 411 which takes the difference 412 between this output 45 and the input (Z) considered at a homogeneous instant, by means of the shift register 410. As a matter of fact, (Z) being an information element produced and used by the second decoder 48 (described hereinafter) of the preceding module, it is indeed preferable not to apply it again during subsequent iterations, in the case of a decoder having at least two decoding modules.

The difference 412 is then transmitted to a multiplier 44 which multiplies this value 412 by a factor $\beta$ greater than 1. This multiplication by $\beta$ makes it possible to give preference, for the second decoding, to the data elements 45 coming from the first decoder 43 in relation to the data elements $(Y_2)_p$ affected by a greater noise since they have come directly from the transmission channel.

The factor $\beta$ may be fixed. However, it is advantageously variable, and depends on the signal-to-noise ratio of the transmission channel. It is furthermore clear that this multiplier is not obligatory for the implementation of the invention. It makes it possible, however, to substantially improve the performance characteristics.

The data elements 46 multiplied by 13 are then interleaved, by means of a matrix 47 with a size $n_E \times n_E$ similar to that used by interleaver 12 of FIG. 2 during the coding. This matrix gives, at output, the value $(X_2)_p$ which is directed towards a second decoder 48, which also takes account of the data elements $(Y_2)_p$, given by the demultiplexing and insertion means 42. This second decoder 48 carries out the decoding corresponding to the second coder 13 of FIG. 2. It is built in such a way that the scale at its input $(X_2)$ is $\beta$ times greater than that of its input $(Y_2)$.

It must be noted that while the coding takes place in parallel, the decoding takes place in series. Thus, the second decoder 48 does not take account of the received data element $(X)_p$ but of the decoded, and naturally interleaved, data element $(X_2)_p$ which is far more reliable. Besides, it is for this reason that this data element has its value increased by the multiplier 44.

Advantageously, the two decoders 43 and 48 implement a maximum likelihood decoding method, of the type using the Viterbi algorithm with weighted decisions.

A preferred embodiment uses decoders such as those described in the contemporaneously filed U.S. application Ser. No. 07/870,483 entitled "Method For The Decoding Of A Maximum Likelihood Convolutional Code With Decision Weighting And Corresponding Decoder", claiming the Convention priority of the French patent application FR 91 05279, filed on Apr. 23, 1991, incorporated hereby reference.

These decoders notably implement two distinct trellises. The decision is taken, in a standard way, by tracing back the optimal path in the first trellis. The weighting is then determined by continuing to trace back the optimal path and its concurrent path in the second trellis.

According to the method of the above-mentioned application, the weighting values are advantageously subjected to a logarithmic compression. However, in the case of the presently described module, it has been seen that it is preferable for only the first decoder 43 to use this law of logarithmic compression. It is postponed, so to speak, in the case of the second decoder as shall be seen further below.

The data elements $(X_3)_p$ produced by the second decoder 48 are fed into a de-interleaving matrix 49, having a size $n_E \times n_E$, fulfilling the dual function of interleaving 48 and of giving the decoded data elements $(S)_p$.

These decoded data elements $(S)_p$ are naturally taken into account only at output of the last module which shows the lowest error rate, except in the case of tests, for example to determine the number of modules needed for a given application.

The data elements $(X_3)_p$ are furthermore directed towards the block 50 for estimating the value $(X)_p$ at input. This block 50 also takes account of the corresponding value $(X'_2)_p$, the input of the second decoder 48 memorized in a shift register 51, acting as a delay line. This register 51 with a length $L_2$, $L_2$ being the latency of the second decoder 48, is designed to compensate for the decoding time of this decoder 48 so that the module 50 considers the input data $(X'_2)_p$ and output data $(X_3)_p$ elements of the second decoder at homogeneous instants.

This estimation block 50 therefore has the role of determining an estimation $(Z)_p$ of the emitted symbol X. This estimation is done so that the variable $(Z)_p$ is affected by additive noise decorrelated from the one affecting the symbol (X). $(Z)_p$ is taken into account in the following module (p+1). Thus, in this module (p+1), the first decoder processes a virtual code with an efficiency rate $R_1/(1+R_1)$, $R_1$ being the efficiency rate of the first coder 11 of FIG. 2.

The decorrelation between the additive noises of $(X)_p$ and $(Z)_p$ may be done, for example, by a function g which removes the contribution related to $(X)_p$ from the result $(X_3)_p$ of the second decoder 48. The function g is advantageously the following:

$$g((X_2)_p, (X_3)_p) = (d_2 \cdot (X_1) - (X_2))/(d_2 - 1)$$

where $d_2$ is the free distance of the second code.

The block 50 then advantageously carries out a logarithmic compression, precisely the one eliminated in the second decoder 48, of the values $g((X_2)_p, (X_3)_p)$ The values thus obtained are transmitted to a de-interleaving matrix, identical to the matrix 49 and giving the output $(Z)_{p+1}$.

The p order module furthermore carries out the transmission of the received data elements (X) and (Y), with delays enabling outputs to be presented at homogeneous instants, for the following p+1 order module. Each module therefore includes two shift registers 53 and 54 respectively for the data elements (X) and (Y). These shift registers act as delay lines and have a length of:

$L_1 + L_2 + 2n_E^2$, so as to compensate for:
  the latency $L_1$ of the first decoder 43;
  the latency $n_E^2$ of the interleaving matrix 47;
  the latency $L_2$ of the first decoder 48;
  the latency $n_E^2$ of the de-interleaving matrices 49 and 52.

Figure 5:
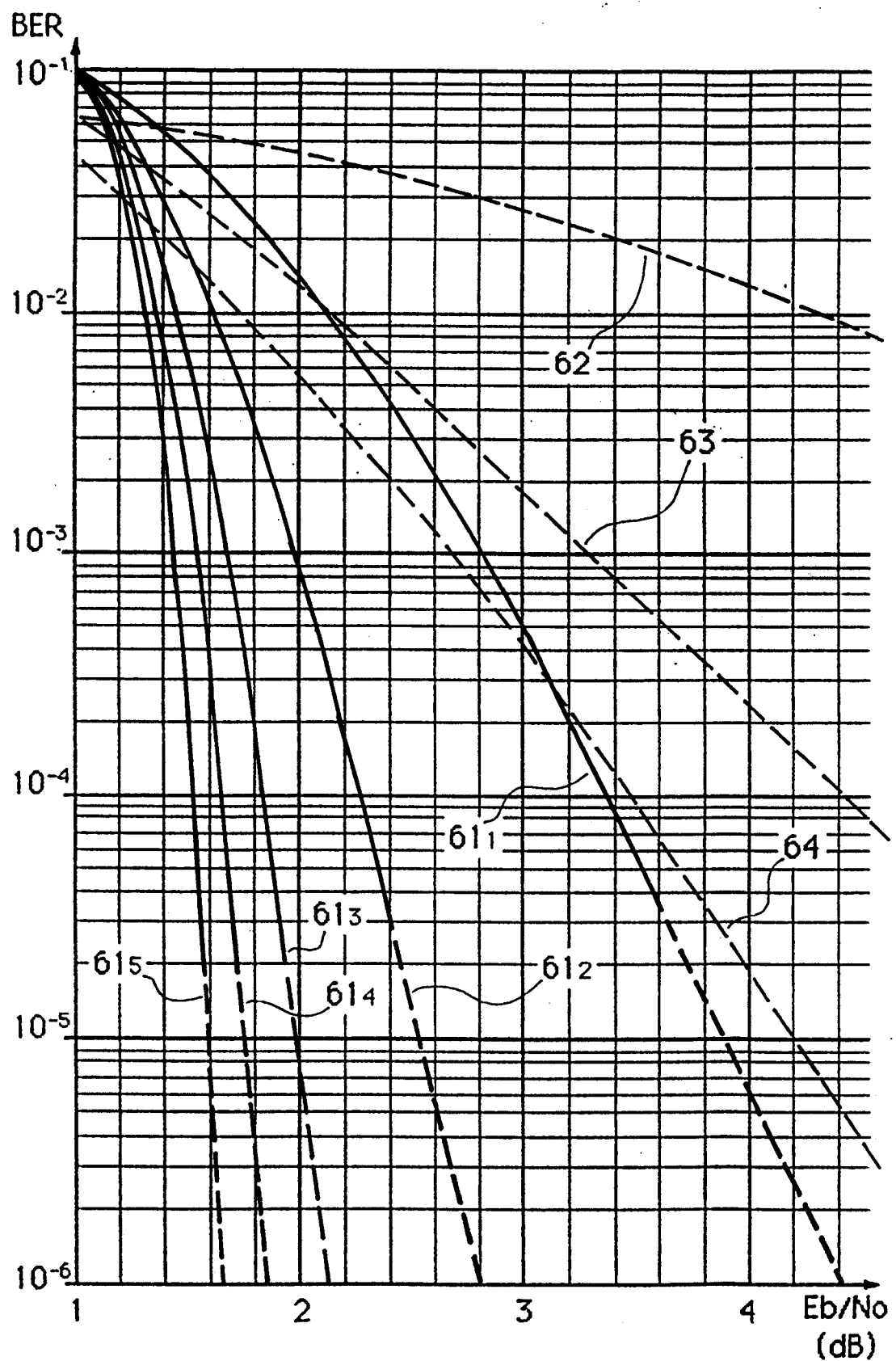
FIGS. 5 and 6 show results obtained by means of a decoder using the modules of FIG. 4, as a function of the number of cascaded modules, in the case of an ideal decoder (FIG. 5) and a decoder that can be implanted on the integrated circuit (FIG. 6).
Figure 6:
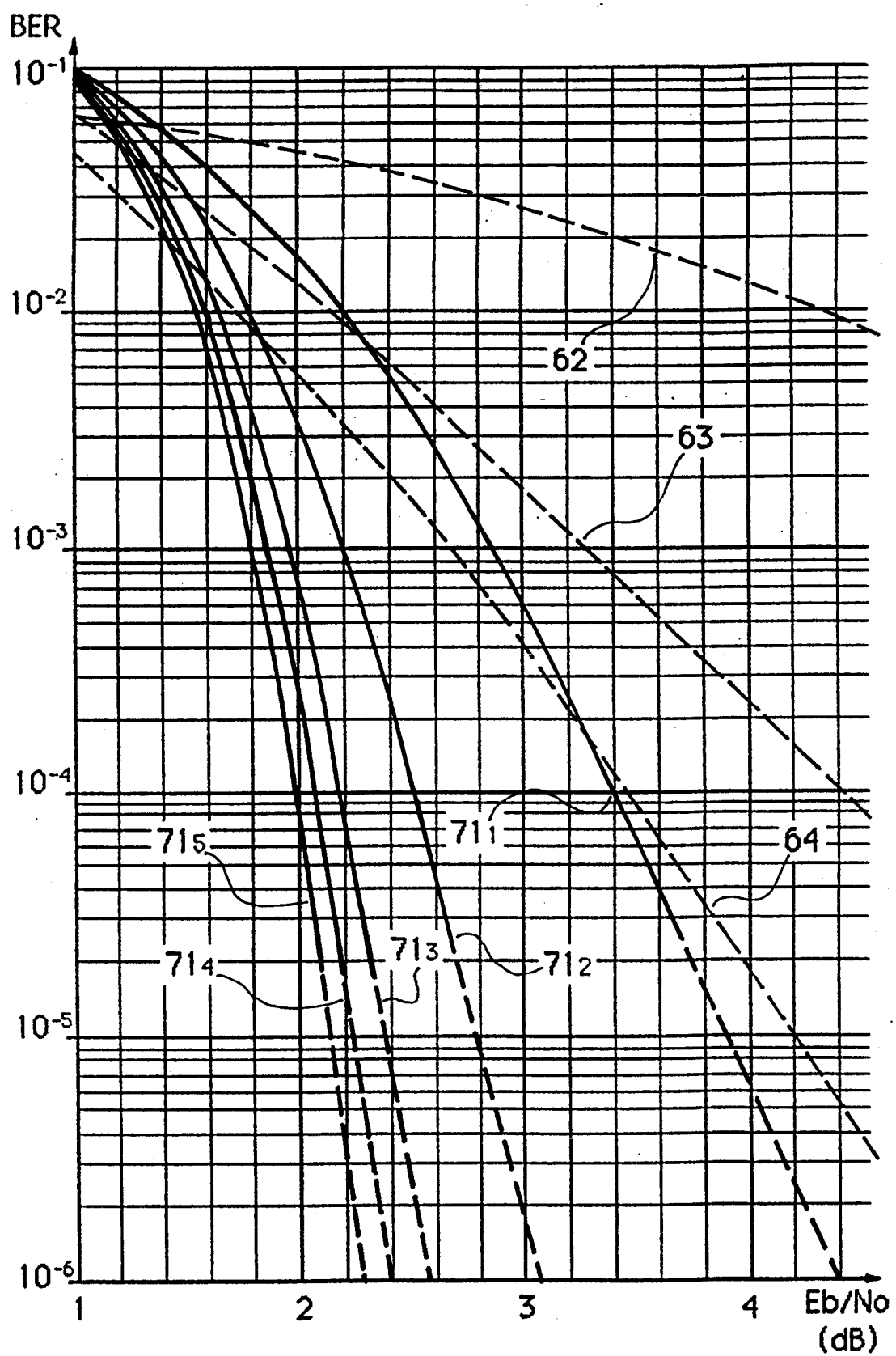

FIGS. 5 and 6 show the results obtained by means of a decoder fitted out with such modules, for a code with an efficiency rate $\frac{1}{2}$ of the type $3/5(\nu=4)/\frac{3}{4}(\nu=4)$, i.e. a parallel concatenation of two codes with efficiency rates 3/5 and $\frac{3}{4}$, at constraint lengths $\nu=4$. The x-axis of the curves represents the signal-to-noise ratio $E_b/N_0$ on the transmission channel ($E_b$: energy received per useful bit; $N_0$: monolateral spectral density of noise). The y-axis represents the observed binary error rate. The curves show the results of decoding obtained by simulation of a Gaussian channel, the demodulation being coherent.

FIG. 5 corresponds to an ideal decoder, working on real variables and with large-sized interleaving. FIG. 6 presents the case of a decoder that can be integrated into an integrated circuit, the main characteristics of which are as follows:
  sample coded on four bits;
  trellis length for each decoder: 58, including 35 revision stages for the weighting;
  $\beta = 1.5$;
  interleaving with dispersal: $31 \times 31$.

The curves $61_1$ to $61_5$ of FIG. 5 and $71_1$ to $71_5$ of FIG. 6 respectively show the outputs $(S)_p$ of a circuit of five identical modules. By way of comparison, we have also shown the curves 62 corresponding to a non-coded transmission, and the curves 63 and 64 corresponding to the correction curves of the simple standard codes with constraint lengths $\nu=4$ and $\nu=6$ respectively.

These curves enable several conclusions to be drawn. It is seen first of all that, when there is a high transmission noise, the results obtained are exceptionally better that those obtained by known techniques. Thus, for example, for an error rate of $10^{-5}$, it is seen that the gain is greater than 1.5 dB for a two-module decoder and greater than 2.5 dB for a five-module decoder, as compared with a standard decoder having a constraint length $\nu=6$ (while the codes used for the simulation of the performance characteristics of the invention have constraint lengths of $\nu=4$).

It is also seen that the performance characteristics of a decoder of the invention are better than those of known decoders, once an error rate of the order of $10^{-4}$ is aimed at, even when only one module is used (curves $61_1$ and $71_1$).

Finally, it can noted that each module added can be used to improve the quality of the decoding, in approaching Shannon's limit which is 0 dB for a code with an efficiency rate of $\frac{1}{2}$. Using this series of curves $61_1$ to $61_5$, it is possible to select the number of modules necessary, depending on a particular application.

The losses in performance, at high noise levels, in the example of modules that can be integrated (curves $71_1$ to $71_5$), in relation to the ideal case, are almost entirely related to the very limited size of the interleaving matrix. Indeed, small-sized ($31 \times 31$) matrices have been chosen so as to limit the surface area of silicon used. With matrices such as these, the surface area of silicon occupied is of the order of 30 mm$^2$. Experience shows, however, that bigger matrices, having sizes of the order of $100 \times 100$ (corresponding to ROMs of quite standard sizes) can be used to greatly improve performance characteristics, while at the same time remaining within limits that are quite acceptable from the viewpoint of the industrial-scale manufacture of an integrated circuit.

What is claimed is:

1. A method for error-correction coding of source digital data elements, comprising the steps of:
    implementing at least two independent and parallel steps of systematic convolutional coding, each of said coding steps taking account of all of said source data elements and providing parallel outputs of distinct series of coded data elements;
    and temporally interleaving said source data elements to modify the order in which said source data elements are taken into account for at least one of said coding steps.

2. A method according to claim 1, comprising a step of systematically eliminating, at predetermined instants of transmission, at least one coded data element of at least one of said series of coded data elements.

3. A method according to claim 2, wherein said elimination step consists of periodically switching among said parallel outputs by which, at each transmission instant, a single coded data element is selected from among the distinct series of coded data elements.

4. A method according to claim 1, wherein each of said temporal interleaving steps is followed by a delaying step, said delaying step assigning, to each of said source data elements coming from said temporal interleaving step, a delay equal to a time of latency for coding the data elements coded by said first coding step.

5. A method according to claim 1, wherein said temporal interleaving step implements at least one interleaving matrix in which said source data elements are recorded in successive rows and read in successive rows.

6. A method according to claim 5 wherein, at writing, two successive source data are written in between two rows selected according to an increment which is strictly greater than 1.

7. A method according to claim 6, wherein said increment between two rows is a function of the position of the column during writing.

8. A method according to claim 5 wherein, at reading, two successive source data are read in two columns selected according to an increment which is strictly greater than 1.

9. A method according to claim 8, wherein said increment between two columns is a function of the position of the row during reading.

10. A method for decoding received digital data elements representing source data elements coded according to the coding method of claim 1, wherein said decoding method comprises an iterative decoding procedure comprising the steps of:
in a first iteration, combining each of said received digital data elements with a predetermined value to form an intermediate data element,
decoding the intermediate data element representing each received data element to produce a decoded data element,
estimating said source data element, by means of said decoded data element, to produce an estimated data element,
and for all subsequent iterations, combining each of said received data elements with one of said estimated data elements estimated during a preceding iteration.

11. A method according to claim 10, wherein said estimating step assigns to said estimated data element an additive noise decorrelated from noise assigned to said received data element.

12. A method according to claim 10, wherein said predetermined value has a zero weight, having no effect on said decoding, and said combinations are, for iterations other than the first one, summations of said received data element and of the estimated data element estimated in the immediately preceding iteration.

13. A method according to claim 10, applied to decoding of data coded according to a method carrying out a joint transmission of source data elements and coded redundancy data elements, wherein said decoding step takes account of all the received data elements, source data elements and coded data elements, and wherein said estimation step is applied solely to the estimation of said source data elements.

14. A method according to claim 10, wherein said decoding step or steps implement maximum likelihood decoding algorithms of the Viterbi algorithm type with weighted decisions.

15. A method according to claim 10, including a demultiplexing step directing the received coded data elements towards said appropriate decoding steps and transmitting zero values at the decoding steps for which no data element has been transmitted.

16. A method according to claim 10, of the type carrying out the decoding of a first and a second series of received data elements representing source data coded according to a coding method implementing two redundant coding steps in parallel, the first coding step carrying out a first redundant coding on all the source data taken in natural order and the second coding step carrying out a second redundant coding on all the source data taken in an order modified by a temporal interleaving step to produce two distinct series of coded data elements, wherein said decoding method comprises the consecutive steps of:
first decoding according to said first redundant coding the first series of received data elements taken together with at least one of said intermediate data elements to produce a series of first decoded data elements;
temporally interleaving, identical to said interleaving step of the coding method, said first decoded data elements to form a series of decoded de-interleaved data elements;
second decoding according to said second redundant coding said decoded de-interleaved data elements and the second series of received data elements to produce a series of second decoded data elements;
estimating the source data from at least one of said series of first and second decoded data elements to produce a series of estimated data elements; and
de-interleaving, symmetrical to said interleaving step, said estimated data elements.

17. A method according to claim 16, wherein said estimating step consists in determining the variable $(d_2 \cdot (X_1) - (X_2))/(d_2 - 1)$ where:
$d_2$ is the free distance of said second redundant coding;
$X_1$ and $X_2$ are the data elements decoded by said first and second decoding steps.

18. A method according to claims 16, wherein said estimation step is followed, before said de-interleaving step, by a logarithmic compression step.

19. A method according to claim 16, wherein said first decoding step is followed by a step of subtracting, from said first decoded data element, said estimated data element.

20. A method according to claim 16, wherein said first decoding step is followed by a step for the multiplication of said first decoded data element by a coefficient $\beta$ that is strictly greater than 1.

21. A method according to claim 20, wherein said coefficient $\beta$ varies as a function of a signal-to-noise ratio of a transmission channel.

22. A decoding module for carrying out an iteration of a decoding procedure comprising at least two inputs, corresponding to at least one received data element and to at least one estimated data element, and at least two outputs corresponding to at least one decoded data element and to at least one estimated data element,
wherein said module is capable of being cascaded with at least one other identical module, each module comprising:
means for summation of the inputs corresponding to said received data element and to said estimated data element;
first decoding means for decoding of data elements coded according to a first redundant coding, taking account of the data elements coming from said summation means;

first interleaving means for interleaving the data elements coming from said first decoding means;

second decoding means for decoding data coded according to a second redundant coding;

means for estimating said received data element or elements;

first de-interleaving means for de-interleaving the data elements coming from said estimation means;

second de-interleaving means for de-interleaving the data elements coming from said second decoding means, delivering the data elements decoded in their original order; and delay means designed to compensate for latencies of the decoding means, interlacing means and de-interlacing means so that all the data elements coming from said module correspond to one and the same instant of reception.

* * * * *